US010984838B2

(12) United States Patent
Jayasena et al.

(10) Patent No.: US 10,984,838 B2
(45) Date of Patent: Apr. 20, 2021

(54) INTERCONNECT ARCHITECTURE FOR THREE-DIMENSIONAL PROCESSING SYSTEMS

(71) Applicant: Advanced Micro Devices, Inc., Sunnyvale, CA (US)

(72) Inventors: Nuwan S. Jayasena, Sunnyvale, CA (US); Yasuko Eckert, Bellevue, WA (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 55 days.

(21) Appl. No.: 14/944,099

(22) Filed: Nov. 17, 2015

(65) Prior Publication Data
US 2017/0139635 A1   May 18, 2017

(51) Int. Cl.
| | | |
|---|---|---|
| G11C 5/02 | (2006.01) | |
| G06F 12/0888 | (2016.01) | |
| G06F 12/0811 | (2016.01) | |
| G06F 12/0815 | (2016.01) | |
| G11C 5/06 | (2006.01) | |

(52) U.S. Cl.
CPC .......... *G11C 5/025* (2013.01); *G06F 12/0888* (2013.01); *G06F 12/0811* (2013.01); *G06F 12/0815* (2013.01); *G06F 2212/1016* (2013.01); *G06F 2212/251* (2013.01); *G06F 2212/254* (2013.01); *G06F 2212/502* (2013.01)

(58) Field of Classification Search
CPC .. G06F 3/0644; G06F 12/0802; G06F 3/0604; G06F 3/0673; G06F 2212/60
See application file for complete search history.

(56) References Cited

U.S. PATENT DOCUMENTS

| | | | | |
|---|---|---|---|---|
| 2014/0281100 | A1* | 9/2014 | Fleischer | G06F 13/364 710/308 |
| 2014/0281204 | A1* | 9/2014 | Jeddeloh | G11C 5/066 711/106 |
| 2014/0351529 | A1* | 11/2014 | Wells | G06F 3/064 711/157 |
| 2015/0324290 | A1* | 11/2015 | Leidel | G06F 12/0817 711/141 |

OTHER PUBLICATIONS

S. Pugsley et al., "NDC: Anaylzing the impact of 3D-Stacked Memory+Logic Devices on MapReduce Workloads", ISPASS 2014, 11 pages.*
S. Pugsley et al., "NDC: Analyzing the Impact of 3D-Stacked Memory+Logic Devices on MapReduce Workloads", ISPASS 2014, 11 pages.
D. P. Zhang et al., "TOP-PIM: Throughput-Oriented Programmable Processing in Memory", HPDC 2014, 13 pages.

* cited by examiner

*Primary Examiner* — Michael Alsip

(57) ABSTRACT

A processing system includes a plurality of processor cores formed in a first layer of an integrated circuit device and a plurality of partitions of memory formed in one or more second layers of the integrated circuit device. The one or more second layers are deployed in a stacked configuration with the first layer. Each of the partitions is associated with a subset of the processor cores that have overlapping footprints with the partitions. The processing system also includes first memory paths between the processor cores and their corresponding subsets of partitions. The processing system further includes second memory paths between the processor cores and the partitions.

22 Claims, 7 Drawing Sheets

INTERCONNECT ARCHITECTURE FOR THREE-DIMENSIONAL PROCESSING SYSTEMS

GOVERNMENT LICENSE RIGHTS

This invention was made with Government support under Prime Contract Number DE-AC52-07NA27344, Subcontract Number B609201 awarded by the National Nuclear Security Agency (NNSA), a division of the Department of Energy (DOE). The Government has certain rights in this invention.

BACKGROUND

Field of the Disclosure

The present disclosure relates generally to processing systems and, more particularly, to stacked memory elements in processing systems.

Description of the Related Art

Processing systems include one or more processing units that execute instructions stored in memory to manipulate data stored in the memory. The processing units can include one or more central processing units (CPUs), graphics processing units (GPUs), accelerated processing units (APUs) that include both central processing and graphics processing capabilities, or application-specific integrated circuits (ASICs). Each processing unit can be made up of one or more processor cores that execute instructions concurrently or in parallel. The conventional design of a processing system distributes the processing units and the memory in a two-dimensional (2-D) plane. For example, the processing units of a processing system may be distributed over the surface of a substrate, a die, or a circuit board. Memory elements may be placed on the same substrate, die, or circuit board as the processing elements or they may be placed on different substrates, dies, or circuit boards. Interconnections between the processing units and the memory elements are formed by wires or traces that lie in the same plane (e.g., in the same substrate, die, or circuit board) as the processing units and the memory elements.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
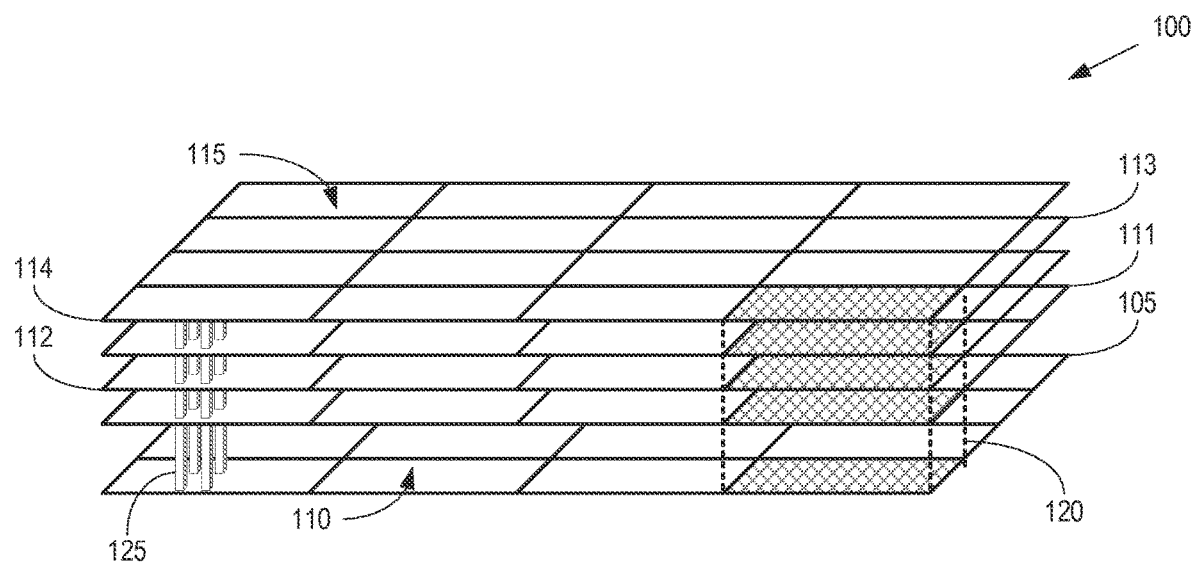
FIG. 1 is a block diagram of a three-dimensional (3-D) processing system according to some embodiments.

Three-dimensional (3-D) processing systems have one or more logic dies that includes one or more processor cores and forms the base of the 3-D structure that also includes a stack of memory dies that include one or more memory elements. In one embodiment, the logic die and the memory dies are interconnected by through-silicon vias (TSVs). Localizing communication between columns (or "vaults") of memory elements and their underlying processor cores can improve the efficiency and performance of a 3-D processing system. Horizontal wire traversal distances can be minimized by constraining each processor core to communicate with memory partitions directly above it in the stack of memory dies, thereby improving the efficiency and performance of the 3-D processing system. However, the performance and efficiency gains are only achieved if data is partitioned between the vaults and all computations on data partitions are assigned to the corresponding processor core. Such 3-D processing systems therefore are limited to applications that are amenable to vault partitioning. Alternatively, the 3-D processing system may implement an interconnect structure that allows any processor core in the logic die to access any memory element. Additional power and bandwidth overhead is needed to support communication between the different vaults, which reduces or eliminates the efficiency and performance gains.

As described herein, a hybrid interconnect system can provide the performance and efficiency gains of vault partitioning while retaining the flexibility of an interconnect structure that allows inter-vault communication. The hybrid interconnect system provides two independent memory access paths between processor cores in the logic die of a 3-D processing system and one or more memory dies that are deployed in a stacked configuration with the logic die. The stacked configuration may include a logic die deployed under the memory dies, a logic die deployed over the memory dies, or a logic die interleaved with the memory dies. Some embodiments of the stacked configuration include multiple logic dies deployed over, under, or interleaved with the memory dies. Each of the memory dies is partitioned and each partition corresponds to one or more of the processor cores in the logic die. A global memory access path provides access to all the partitions in each of the memory dies. A plurality of local memory access paths connects the plurality of processor cores to a corresponding subset of the partitions associated with each subset of processor cores. The subset of the partitions associated with a set of processor cores may have the same (or overlapping) footprint as the subset of processor cores. In some embodiments the subset of the partitions may also include partitions of the memory dies that neighbor the partitions that have the same (or overlapping) footprint as the set of processor cores.

The processor cores can selectively access the memory dies in response to a memory access request using the global or the local memory access paths. For example, a processor core can selectively access its corresponding subset of partitions via its local memory access path based on a physical address associated with the memory access request, an instruction that invokes the memory access request, a type of operation associated with the memory access request, content of the accessed data, and the like. Some embodiments of the local memory access paths bypass some or all of the levels of a cache hierarchy associated with the processor cores, while the global memory access path may convey data between the plurality of memory dies and the cache hierarchy or vice versa. The partitions of the memory dies associated with the processor cores and accessible by the local memory path may be disjoint from other partitions of the memory dies that are accessible by the global memory access path. Alternatively, the partitions accessible by the global memory access path and the plurality of local memory access paths may fully overlap or partially overlap so that at least some portion of the partitions are accessible by both the global memory access path and one or more of the local memory access paths.

FIG. 1 is a block diagram of a three-dimensional (3-D) processing system 100 according to some embodiments. The 3-D processing system 100 is an integrated circuit device that includes a logic layer 105 that includes a plurality of processor cores 110 (only one indicated by a reference numeral in the interest of clarity) for executing instructions associated with applications. The processor cores 110 may execute the instructions independently, concurrently, or in parallel. More or fewer processor cores 110 may be implemented in or on some embodiments of the logic layer 105. The 3-D processing system 100 also includes memory layers 111, 112, 113, 114 that are referred to collectively as "the memory layers 111-114." Each of the memory layers 111-114 is divided into partitions 115 (only one indicated by a reference numeral in the interest of clarity). More or fewer memory layers 111-114 may be stacked to form some embodiments of the 3-D processing system 100. The memory layers 111-114 may implement any of a variety of memory cell architectures, including, but not limited to, volatile memory architectures such as dynamic random access memory (DRAM) and static random access memory (SRAM), or non-volatile memory architectures, such as read-only memory (ROM), flash memory, ferroelectric RAM (F-RAM), magnetoresistive RAM, and the like. Signals are conveyed between the logic layer 105 and the memory layers 111-114 using conductive structures such as through-silicon vias (TSVs) 125. As used herein, the term "layer" refers to a two-dimensional (2-D) structure having logical or memory elements formed therein or thereon. For example, a layer may be formed using a substrate, die, circuit board, or other substantially planar structure.

The processor cores 110 are associated with partitions 115 in a vertical column (or "vault") above the corresponding processor core 110. For example, the crosshatched processor core 110 is associated with the corresponding crosshatched partitions 115 in the memory layers 111-114. The vertical column 120 (or vault) is indicated by the dotted lines. The vertical column 120 may also be referred to as a domain of vertical locality. The partitions 115 in the vertical column 120 have footprints that overlap or coincide with the footprint of the processor core 110 in the vertical column 120. The footprint of the partitions 115 corresponds to a two-dimensional lateral extent of the circuitry used to implement the partitions 115, e.g., as projected onto the plane of the layer 105. The footprint of the processor core 110 corresponds to a two-dimensional lateral extent of the circuitry used to implement the processor core 110, e.g., as projected onto the plane of the layer 105. The footprints are considered to overlap when at least a portion of the footprints encompass the same area when projected onto the plane of the layer 105. In some embodiments, the vault associated with a processor core 110 may also include neighboring partitions 115, such as partitions 115 that are adjacent to the partitions 115 in the vertical column 120. Some embodiments of the memory layers 111-114 may be divided into more or fewer partitions 115.

Interconnect structures that allow all of the processor cores 110 to access all of the partitions 115 in the memory layers 111-114 incur power and bandwidth overhead to provide global access. The performance and efficiency of the 3-D processing system 100 can be improved by localizing communication within the vertical column 120. For example, data and instructions used by the processor core 110 may be stored in the partitions 115 in the corresponding vertical column 120 to minimize horizontal wire traversal distances (and the associated energy and bandwidth overhead) needed to access the data and instructions. However, exploiting locality within the vertical column 120 requires that all the data and instructions needed by the corresponding processor core 110 are stored in the partitions 115 of the memory layers 111-114 that are in the corresponding vertical column 120. Partitioning the data and instructions in this way introduces significant complexity into application-level, system-level, and user-level software subsystems.

The 3-D processing system 100 implements a hybrid interconnect system that provides two independent memory access paths between the processor cores 110 in the logic layer 105 and the partitions 115 of the memory layers 111-114. A global memory access path provides access to all the partitions 115 in each of the memory layers 111-114. A plurality of local memory access paths connects each of the processor cores 110 to a corresponding subset of the partitions 115. For example, a local memory access path may be used to connect the processor core 110 and the partitions 115 in the vertical column 120. Some embodiments of the local and global memory access paths are implemented using wires, traces, or other interconnects that are formed in or on the logic layer 105. The processor cores 110 selectively access partitions 115 in the memory layers 111-114 using either the global memory access path or the local memory access path, thereby providing the benefits of localized communication within the vertical column 120 and the benefits of global communication to all of the partitions 115 of the memory layers 111-114.

Figure 2:
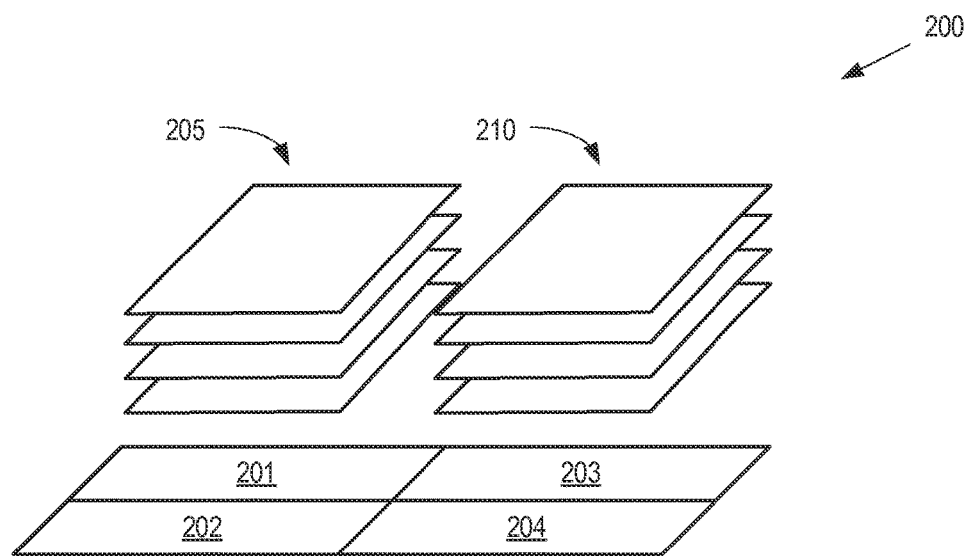
FIG. 2 is a block diagram of a 3-D processing system that includes multiple processor cores associated with each memory stack according to some embodiments.

FIG. 2 is a block diagram of a 3-D processing system 200 that includes multiple processor cores associated with each memory stack according to some embodiments. The 3-D processing system 200 includes four processor cores 201, 202, 203, 204, which are referred to collectively as "the processor cores 201-204." The memory layers in the 3-D processing system 200 are divided into two sets 205, 210 of partitions and each of the sets 205, 210 are associated with two of the processor cores 201-204. For example, the set 205 is associated with the processor cores 201, 202 and the set 210 is associated with the processor cores 203, 204. Thus, the processor cores 201, 202 may perform local accesses to the set 205 and global accesses to the set 210. The processor cores 203, 204 may perform global accesses to the set 205 and local accesses to the set 210.

The 3-D processing system 200 implements a hybrid interconnect structure that supports local memory access paths between the sets 205, 210 and their corresponding processor cores 201-204 and global memory access paths between the processor cores 201-204 and all of the partitions in the sets 205, 210. The processor cores 201-204 may therefore selectively access memory using the local or global memory access paths. For example, the processor core 201 or the processor core 202 may access information such as data or instructions stored in the set 205 using a local memory access path. For another example, the processor core 201 or the processor core 202 may access information stored in the set 210 using the global memory access path.

Figure 3:
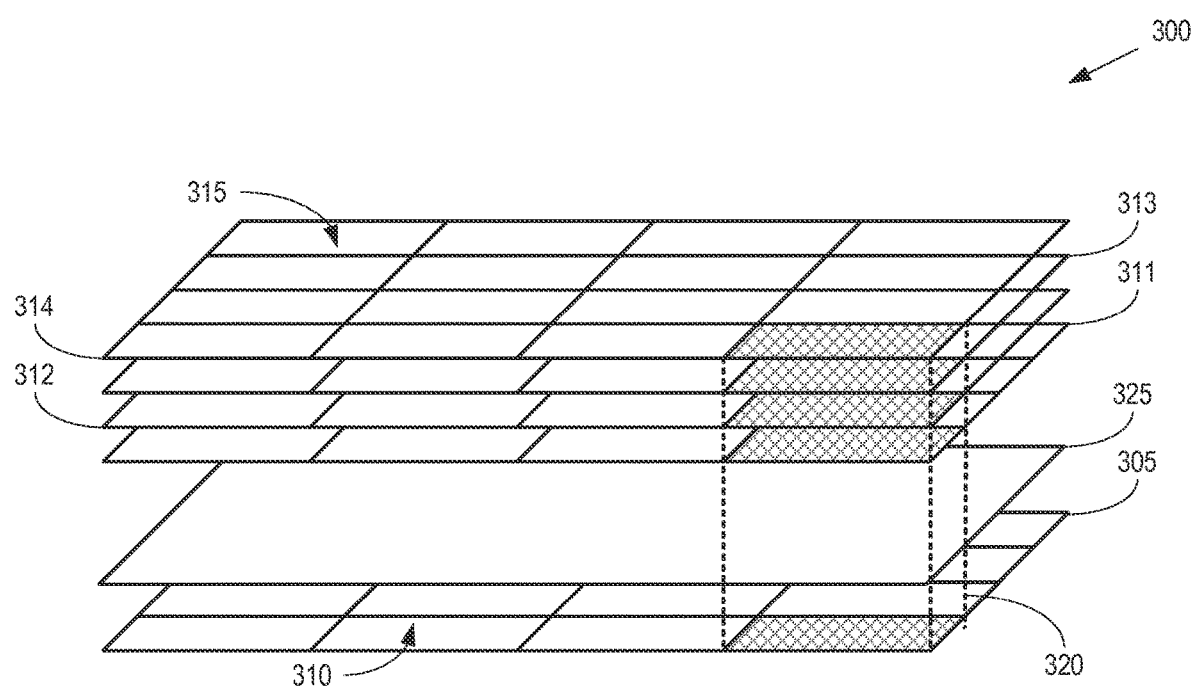
FIG. 3 is a block diagram of a 3-D processing system that includes an interconnect layer according to some embodiments.

FIG. 3 is a block diagram of a 3-D processing system 300 that includes an interconnect layer according to some embodiments. The 3-D processing system 300 includes a logic layer 305 that includes a plurality of processor cores 310 (only one indicated by a reference numeral in the interest of clarity) for executing instructions associated with applications. The processor cores 310 may execute the instructions independently, concurrently, or in parallel. More or fewer processor cores 310 may be implemented in or on some embodiments of the logic layer 305. The 3-D processing system 300 also includes memory layers 311, 312, 313, 314 that are referred to collectively as "the memory layers 311-314." Each of the memory layers 311-314 is divided into partitions 315 (only one indicated by a reference numeral in the interest of clarity). More or fewer memory layers 311-314 may be stacked to form some embodiments of the 3-D processing system 300 and some embodiments of the memory layers 311-314 may be divided into more or fewer partitions 315.

The processor cores 310 are associated with partitions 315 in a vertical column 320 (or "vault") above the corresponding processor core 310, as indicated by the crosshatching. The partitions 315 in the vertical column 320 have footprints that overlap or coincide with the footprint of the processor core 310 in the vertical column 320. In some embodiments, the vault associated with a processor core 310 may also include neighboring partitions 315, such as partitions 315 that are adjacent to the partitions 315 in the vertical column 320.

The 3-D processing system 300 shown in FIG. 3 differs from the 3-D processing system shown in FIG. 1 in that the 3-D processing system 300 includes an interconnect layer 325. In the illustrated embodiment, the interconnect layer 325 is deployed in a stacked configuration with the logic layer 305 and the memory layers 311-314. For example, the interconnect layer 325 may be deployed between the logic layer 305 and the memory layers 311-314, as shown in FIG. 3. However, in some embodiments, the interconnect layer 325 may be deployed in other locations such as above the memory layers 311-314 or below the logic layer 305. The interconnect layer 325 implements a hybrid interconnect system that provides two independent memory access paths between the processor cores 310 in the logic layer 305 and the partitions 315 of the memory layers 311-314. A global memory access path provides access to all the partitions 315 in each of the memory layers 311-314. A plurality of local memory access paths connects each of the processor cores 310 to a corresponding subset of the partitions 315. For example, a local memory access path implemented in the interconnect layer 325 may be used to connect the processor core 310 and the partitions 315 in the vertical column 320. In some embodiments, the local and global memory access paths are implemented using wires, traces, or other interconnects that are formed in or on the interconnect layer 325. Signals may be conveyed between the logic layer 305, the interconnect layer 325, and the memory layers 311-314 using conductive structures such as through-silicon vias (TSVs).

Figure 4:
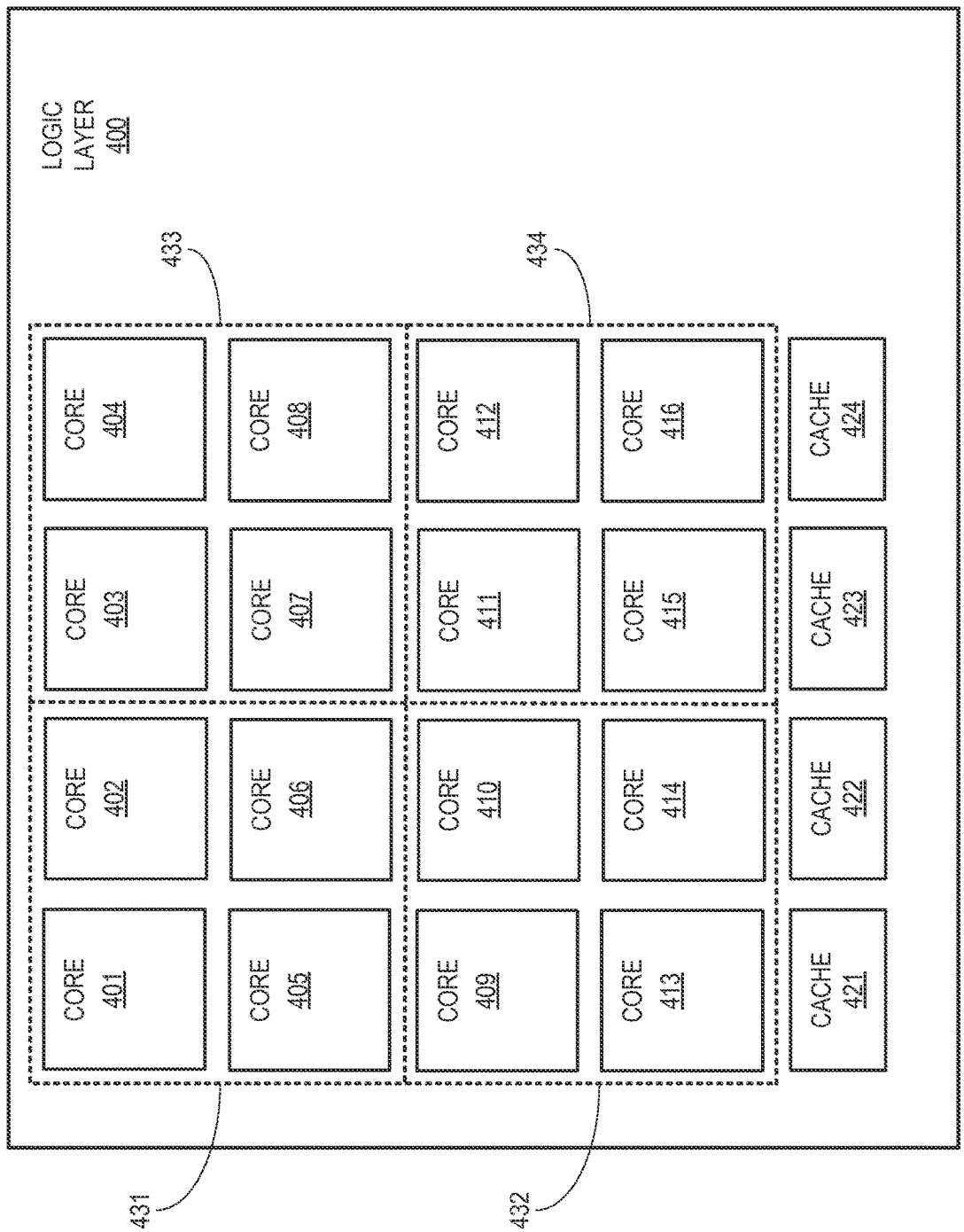
FIG. 4 is a block diagram of a logic layer of a 3-D processing system in accordance with some embodiments.

FIG. 4 is a block diagram of a logic layer 400 of a 3-D processing system in accordance with some embodiments. The logic layer 400 includes multiple processor cores 401, 402, 403, 404, 405, 406, 407, 408, 409, 410, 411, 412, 413, 414, 415, 416 (collectively referred to herein as "the processor cores 401-416") that can independently execute instructions concurrently or in parallel. In some embodiments, the processor cores 401-416 may be associated with one or more CPUs, GPUs, APUs, or ASICs (not shown in FIG. 4). The processor cores 401-416 may be associated with one or more caches 421, 422, 423, 424 that are collectively referred to herein as "the caches 421-424". Some embodiments of the caches 421-424 include an L2 cache for caching instructions or data, one or more L1 caches, or other caches. Some embodiments of the caches 421-424 may be subdivided into an instruction cache and a data cache.

The footprints of one or more of the processor cores 401-416 on the logic layer 400 may overlap with footprints 431, 432, 433, 434 (collectively referred to as "the footprints 431-434") of partitions of memory elements in one or more memory layers that are deployed in a stacked configuration with the logic layer 400 to form the 3-D processing system. The processor cores 401-416 and associated partitions within the footprints 431-434 may form a vertical column or vault, as discussed herein. For example, the processor cores 401, 402, 405, 406 may be a part of a vertical column that includes partitions within the footprint 431 in one or more overlaying, underlying, or interleaved memory layers. The processor cores 401, 402, 405, 406 may therefore selectively access memory in the partitions within the footprint 431 using a local memory access path, as discussed herein. The processor cores 401, 402, 405, 406 may also access memory in the partitions associated with the footprints 432, 433, 434 (and, in some embodiments, the footprint 431) using a global memory access path, as discussed herein. Although each footprint 431-434 overlaps with four of the processor cores 401-416, some embodiments may include other footprints that overlap with more or fewer of the processor cores 401-416.

Figure 5:
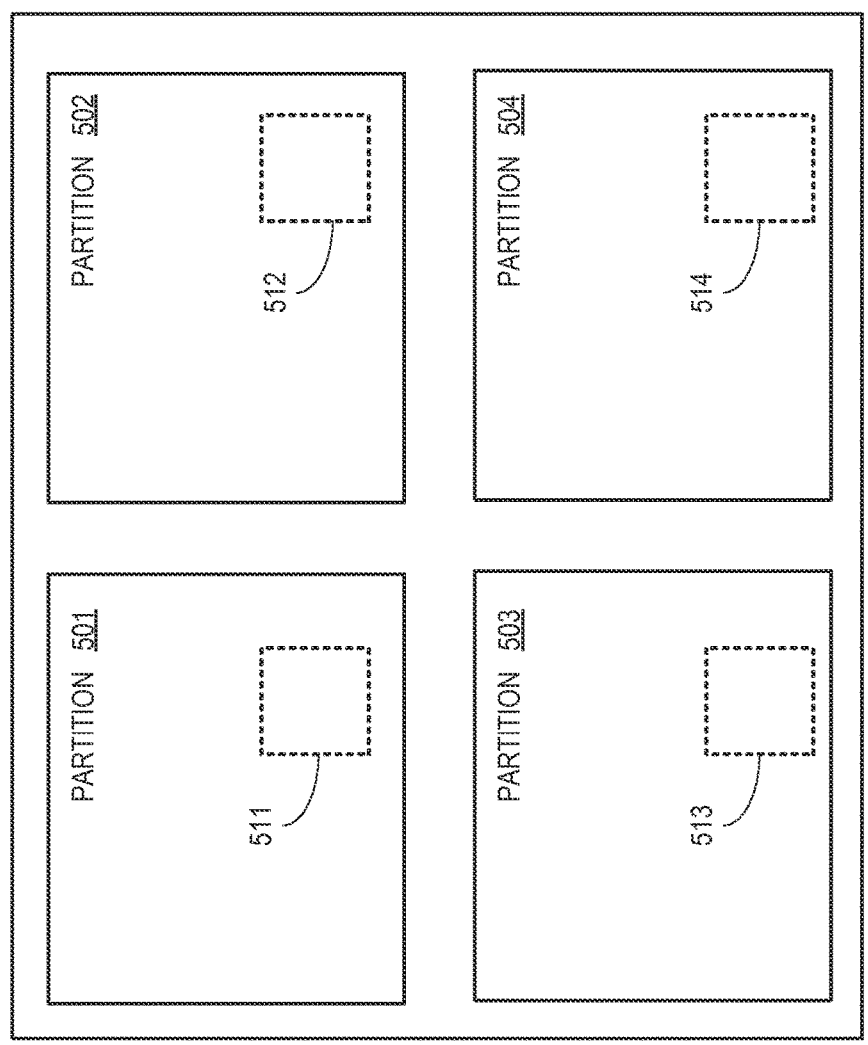
FIG. 5 is a block diagram of a memory layer of a 3-D processing system in accordance with some embodiments.

FIG. 5 is a block diagram of a memory layer 500 of a 3-D processing system in accordance with some embodiments. The memory layer 500 is deployed in a stacked configuration with a logic layer such as the logic layer 400 shown in FIG. 4. The memory layer 500 may be one of a plurality of memory layers that are stacked over the logic layer to form the 3-D processing system. The memory layer 500 includes partitions 501, 502, 503, 504 that are referred to collectively as "the partitions 501-504." The footprints of each of the partitions 501-504 overlap the footprints of one or more processor cores. For example, the footprints of the partitions 501-504 may correspond to the footprints 431-434 and may therefore overlap with the footprints of the processor cores 401-416 shown in FIG. 4. The processor cores may therefore selectively use local memory access paths or global memory access paths to access memory locations in the partitions 501-504.

The partitions 501-504 may be subdivided into different portions that can be accessed by a local memory path or a global memory path. Some embodiments of the partitions 501-504 include portions 511, 512, 513, 514 (collectively referred to as "the disjoint portions 511-514") that are disjoint from the remainder of the partitions 501-504. Access to the disjoint portions 511-514 may be restricted to either the local memory path or the global memory path. For example, only the local memory path may be used to access information in the disjoint portions 511-514. The disjoint portions 511-514 may therefore be used to store and retrieve private data associated with a particular processor core (or set of processor cores) without the need for synchronization between processor cores or the risk of access by other processor cores. For another example, the local memory access paths may be used to access all locations within the partitions 501-504 (including the disjoint portions 511-514)

but the global memory access path may be restricted to accessing information in the disjoint portions 511-514. Accessibility of the partitions 501-504 or the disjoint portions 511-514 may be defined in hardware or using software at boot time or run time, e.g., by setting hardware configuration registers.

Figure 6:
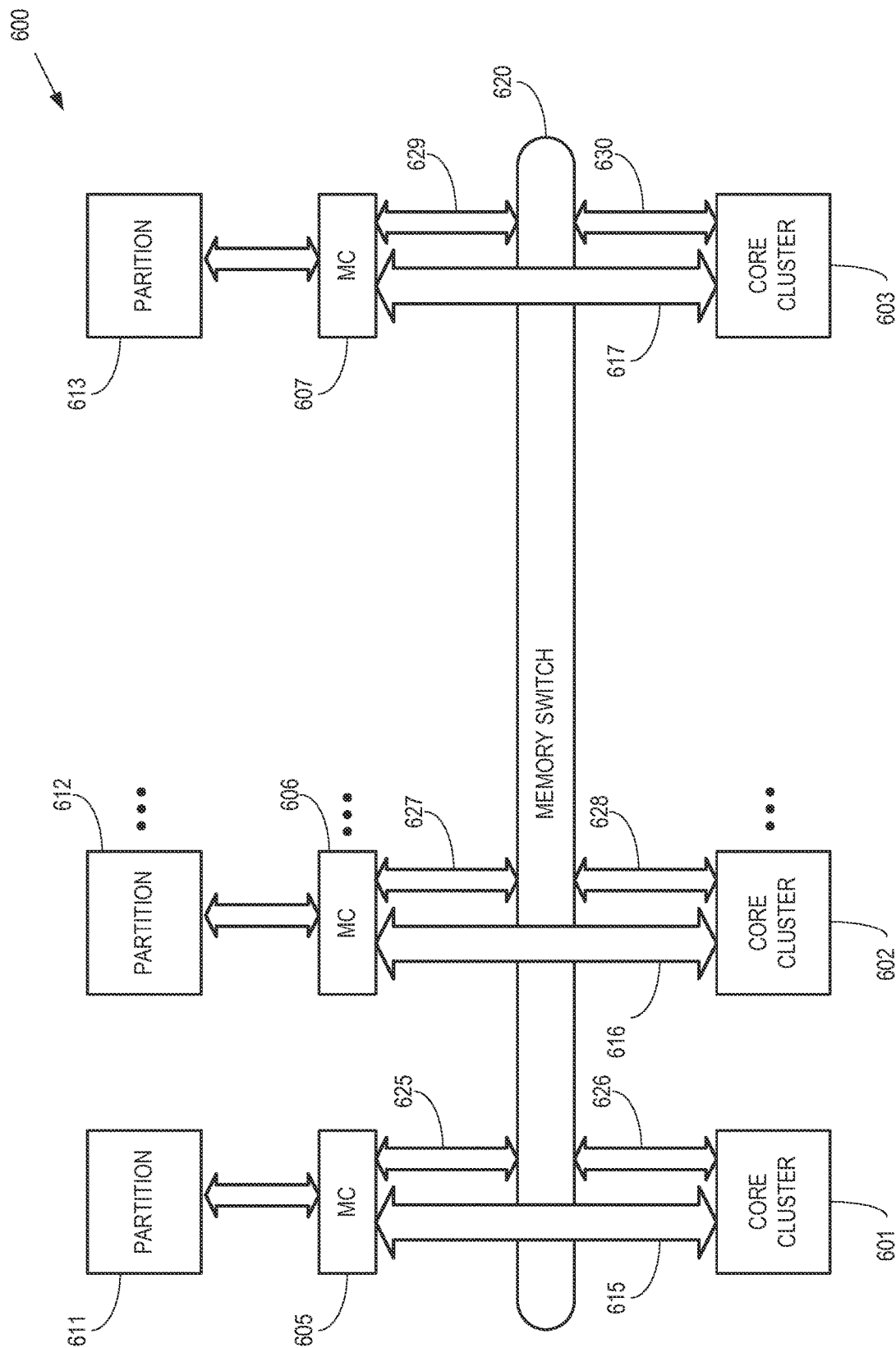
FIG. 6 is a block diagram of a 3-D processing system that includes local memory access paths and a global memory access path according to some embodiments.

FIG. 6 is a block diagram of a 3-D processing system 600 that includes local memory access paths and a global memory access path according to some embodiments. The processing system 600 may be used to implement some embodiments of the 3-D processing systems 100, 200, 300 shown in FIGS. 1-3. The processing system 600 includes a plurality of core clusters 601, 602, 603 (collectively referred to as "the core clusters 601-603") that each include one or more processor cores. The processing system 600 also includes a plurality of memory controllers (MC) 605, 606, 607 (collectively referred to as "the memory controllers 605-607") that mediate access to partitions 611, 612, 613 (collectively referred to as "the partitions 611-613") of memory layers such as the memory layers 111-114 shown in FIG. 1. The memory layers are deployed in a stacked, 3-D configuration with a logic layer (or, in some embodiments, an interconnect layer) that implements the core clusters 601-603 and the memory controllers 605-607.

The 3-D processing system 600 includes a hybrid interconnect structure that includes local memory access paths 615, 616, 617 (collectively referred to as "the local memory access paths 615-617") that support direct memory access requests from each of the core clusters 601-603 to the corresponding partitions 611-613 in the one or more memory layers. For example, the core cluster 601 can issue memory access requests directly to the partition 611 via the local memory access path 615, the core cluster 602 can issue memory access requests directly to the partition 612 via the local memory access path 616, and the core cluster 603 can issue memory access requests directly to the partition 613 via the local memory access path 617. Some embodiments of the memory controller 605-607 may treat memory access requests that are routed over the local memory access path as higher priority, e.g., to provide lower latency or latency bounds for the memory accesses. The hybrid interconnect structure also includes a global memory access path that is implemented using a memory switch 620. In the illustrated embodiment, the global memory access path provides paths between the core clusters 601-603 and the partitions 611-613 using the memory switch 620 and the links 625, 626, 627, 628, 629, and 630 (collectively referred to herein as "the links 625-630"). The links 625-630 may be implemented as wires, traces, vias, and the like. Each of the core clusters 601-603 can issue memory access requests to any of the partitions 611-613 via the memory switch 620 using the global memory access path.

Figure 7:
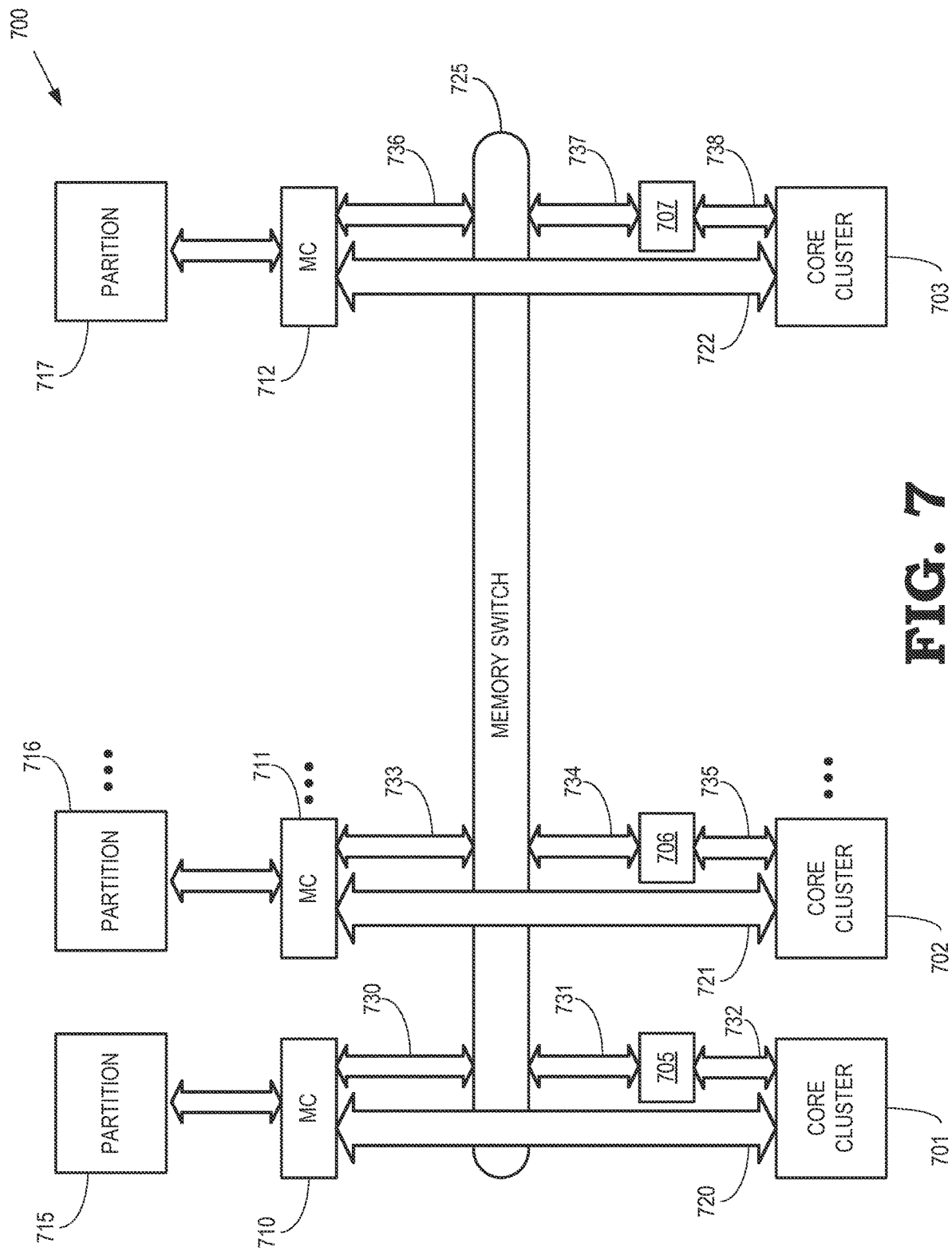
FIG. 7 is a block diagram of a 3-D processing system that includes local memory access paths, a global memory access path, and one or more caches according to some embodiments.

FIG. 7 is a block diagram of a 3-D processing system 700 that includes local memory access paths, a global memory access path, and one or more caches according to some embodiments. The processing system 700 may be used to implement some embodiments of the 3-D processing systems 100, 200, 300 shown in FIGS. 1-3. The processing system 700 includes a plurality of core clusters 701, 702, 703 (collectively referred to as "the core clusters 701-703") that each include one or more processor cores. The core cluster 701-703 are associated with caches 705, 706, 707 (collectively referred to as "the caches 705-707"). The caches 705-707 may be representative of an L1 cache, an L2 cache, an L3 cache, another type of cache, or a cache hierarchy including more than one level of cache. The processing system 700 also includes a plurality of memory controllers (MC) 710, 711, 712 (collectively referred to as "the memory controllers 710-712") that mediate access to partitions 715, 716, 717 (collectively referred to as "the partitions 715-717") of memory layers such as the memory layers 111-114 shown in FIG. 1. The memory layers are deployed in a stacked, 3-D configuration with a logic layer (or, in some embodiments, an interconnect layer) that implements the core clusters 701-703 or the memory controllers 710-712.

The 3-D processing system 700 includes a hybrid interconnect structure that includes local memory access paths 720, 721, 722 (collectively referred to as "the local memory access paths 720-722") that support direct memory access requests from each of the core clusters 701-703 to the corresponding partitions 715-717 in the one or more memory layers. For example, the core cluster 701 can issue memory access requests directly to the partition 715 via the local memory access path 720, the core cluster 702 can issue memory access requests directly to the partition 716 via the local memory access path 721, and the core cluster 703 can issue memory access requests directly to the partition 717 via the local memory access path 722. The local memory access paths 720-722 bypass the corresponding caches 705-707 so information associated with memory access requests transmitted via the local memory access paths 720-722 is not cached in the corresponding caches 705-707. Thus, cache coherence does not need to be preserved between the core clusters 701-703 for memory accesses performed via the local memory access paths 720-722. In some embodiments, coherence memory bypassing is used only for memory accesses that do not need to maintain coherency, such as scratchpad data, data that are explicitly marked as private to the associated set of processors, and back-up or redundant copies of the architectural state of the associated set of processors (e.g., registers). Thus, in some embodiments, the local memory access paths 720-722 selectively bypass the caches 705-707 and not all of the memory access requests transmitted via the local memory access paths 720-722 necessarily bypass the caches 705-707.

The hybrid interconnect structure also includes a global memory access path that is implemented using a memory switch 725. In the illustrated embodiment, the global memory access path provides paths between the core clusters 701-703 and the partitions 715-717 using the memory switch 725 and the links 730, 731, 732, 733, 734, 735, 736, 737, and 738 (collectively referred to herein as "the links 730-738"). The links 730-738 may be implemented as wires, traces, vias, and the like. Each of the core clusters 701-703 can issue memory access requests to any of the partitions 715-717 via the global memory access path. Memory access requests transmitted via the global memory access path do not bypass the caches 705-707 so information associated with memory access requests transmitted via the global memory access path may be cached in the corresponding caches 705-707. Cache coherence may also need to be preserved between the core clusters 701-703 for memory access requests transmitted via the global memory access path. Although FIG. 7 illustrates embodiments in which the local memory access paths 720-722 bypass the caches 705-707 and the global memory access path does not bypass the caches 705-707, some embodiments of the local memory access paths 720-722 do not bypass the caches 705-707 and some embodiments of the global memory access path bypass the caches 705-707.

Figure 8:
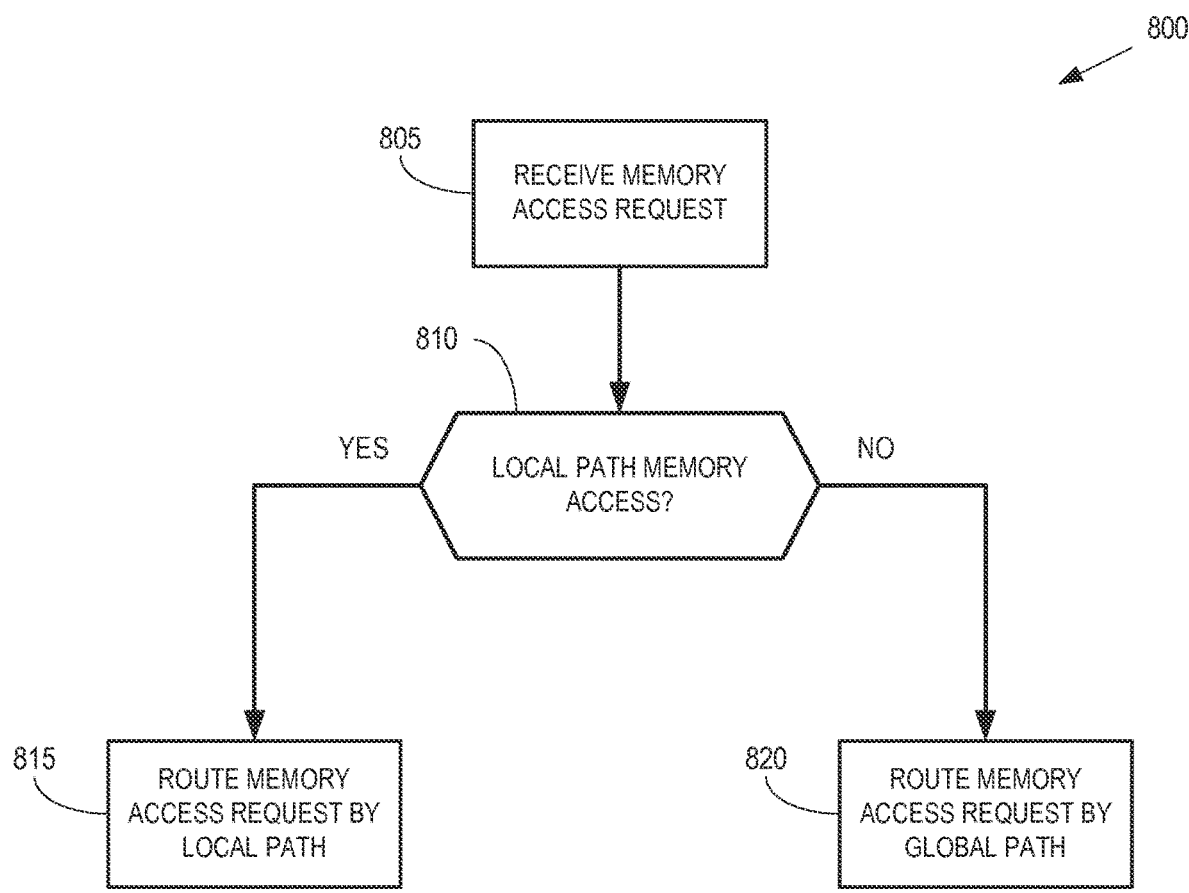
FIG. 8 is a flow diagram of a method for selectively routing memory access requests via local memory access paths or a global memory access path according to some embodiments.

FIG. 8 is a flow diagram of a method 800 for selectively routing memory access requests via local memory access paths or a global memory access path according to some embodiments. The method 800 may be implemented by some embodiments of the processing systems 100, 200, 300, 600, 700 shown in FIGS. 1-3, 6, and 7. At block 805, a memory access request is received or generated by a processor core or core cluster. Some embodiments of the memory access request include information indicating a physical address of a memory location, an operation type associated with the memory access request, data content being accessed by the memory access request, and the like.

At decision block 810, the processor core (or core cluster) determines whether the memory access request can be performed using a local memory access. For example, the processor core (or core cluster) may determine whether the memory access request is directed to information stored in a vault associated with the processor core or core cluster. As discussed herein, vaults associated with processor cores or core clusters are formed of partitions of memory layers in a 3-D processing system that have an overlapping footprint with a processor core or core cluster. Some embodiments of the vault also include one or more partitions that neighbor the partitions that have the overlapping footprint with the processor core or core cluster. The memory access request is selectively routed (at block 815) over a local path between the processor core (or core cluster) and the vault if the memory access request is directed to information stored in the vault. Otherwise, the memory access request is selectively routed (at block 820) over the global path.

Some embodiments of the processor core (or core cluster) use properties of the memory access request, characteristics of the memory access request, or information included in the memory access request to determine (at decision block 810) whether the memory access request can be accessed over the local path. For example, the processor core (or core cluster) can make the determination based on a physical address of a memory location addressed by the memory access request. If the physical address is within the vault, the memory access request is routed (at block 815) over the local path. Otherwise, the memory access request is routed (at block 820) over the global path. In some embodiments, only a subset of addresses within the local vault are accessed over the local path, as discussed herein. For another example, the processor core (or core cluster) selectively routes the memory access request data based on the instruction itself so that different types of memory access instructions are routed over the local path and the global path. For yet another example, the processor core (or core cluster) selectively route the memory access request based on an operation type associated with the memory access request. The local path may be reserved for special types of operations (e.g., context save/restore, local scratchpad memory access) so that the type of operation (which may correspond to different origination points in fixed-function logic) determines whether the memory access request is routed over the local path or the global path. For yet another example, the processor core (or core cluster) selectively routes the memory access request based on the data that is being accessed by the memory access request. The local path may be reserved for certain types of data that are accessible only by the associated processor core (or core cluster). Examples of data types that may be reserved for access via the local path include, but are not limited to, back-up or main copies of architectural state to facilitate context switching, power gating, and checkpoint-based execution rollback to recover from errors.

Some embodiments of the processing system implement a programming environment or framework (such as Heterogeneous System Architecture, HSA) that requires a shared global address space among the processor cores (or core clusters). The hybrid interconnect architecture disclosed herein may support such models while still enabling or improving the efficiency of features/capabilities of the processing system. For example, memory access requests for data that is known to be local (or can trivially be made local) can be routed (at block 815) over the local path. Examples of such local data include register spills, stack frames, and context save/restore. For another example, memory access requests can be routed (at block 815) over the local path to virtualize fixed-sized static random access memory (SRAM) resources in processor cores (or core clusters). Virtualization can be achieved by reserving a region of memory only accessible by special operations that are routed over the local path and are used to save/restore state from SRAMs in the processor cores or core clusters. The special operations may include virtual register files or scratchpad memories that are mapped to the memory space of the vault and accessed via the local path. For yet another example, real-time or other high-priority tasks may use memory access request that are routed (at block 815) over the local path. The real-time or other high-priority tasks may have latency bounds or quality-of-service guarantees that are tighter than those that can be provided for memory access request that are routed (at block 820) over the global path. For yet another example, operations used for low-overhead gathering of performance statistics, memory address traces or other information about the hardware, as well as logging this information, may be routed (at block 815) over the local path to minimize application-level accesses that are routed (at block 820) over the global path.

In some embodiments, the apparatus and techniques described above are implemented in a system comprising one or more integrated circuit (IC) devices (also referred to as integrated circuit packages or microchips), such as the 3-D processing system described above with reference to FIGS. 1-8. Electronic design automation (EDA) and computer aided design (CAD) software tools may be used in the design and fabrication of these IC devices. These design tools typically are represented as one or more software programs. The one or more software programs comprise code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer readable storage medium accessible to the computing system. Likewise, the code representative of one or more phases of the design or fabrication of an IC device may be stored in and accessed from the same computer readable storage medium or a different computer readable storage medium.

A computer readable storage medium may include any non-transitory storage medium, or combination of non-transitory storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

In some embodiments, certain aspects of the techniques described above may be implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. An apparatus comprising:
   a plurality of processor cores formed in a first layer of an integrated circuit device;
   a plurality of vertical memory columns formed above the first layer, wherein:
      each of the plurality of vertical memory columns has a footprint that overlaps with a footprint of one of a plurality of subsets of the plurality of processor cores first memory paths in the plurality of vertical memory columns, the first memory paths connecting the plurality of subsets of the processor cores to corresponding ones of the plurality of vertical memory columns; and
      second memory paths that provide each of the plurality of processor cores with access to all the plurality of vertical memory columns, the second memory paths separate from the first memory paths.

2. The apparatus of claim 1, wherein the plurality of subsets of the plurality of processor cores associated with the plurality of vertical memory columns comprises at least one processor core that neighbors a processor core that has an overlapping footprint with the plurality of vertical memory columns.

3. The apparatus of claim 1, wherein the plurality of processor cores selectively access a corresponding vertical memory column using the first memory paths or any of the plurality of vertical memory columns using the second memory paths.

4. The apparatus of claim 3, wherein information associated with the plurality of processor cores is selectively stored in their corresponding subsets of the plurality of vertical memory columns, and wherein the plurality of processor cores selectively access their corresponding subsets of the plurality of vertical memory columns using the first memory paths in response to a memory access request for information that is selectively stored in their corresponding subsets of the plurality of vertical memory columns.

5. The apparatus of claim 4, wherein the plurality of processor cores selectively access the corresponding subsets of the plurality of vertical memory columns using the first memory paths in response to a location in the subsets of the plurality of vertical memory columns being indicated by at least one of a physical address associated with the memory access request, an instruction that invokes the memory access request, a type of operation associated with the memory access request, and content of the accessed information.

6. The apparatus of claim 1, further comprising:
   caches associated with the plurality of processor cores, wherein at least one of the first memory paths or the second memory paths bypasses the caches.

7. The apparatus of claim 1, wherein the plurality of vertical memory columns are subdivided into first portions that are accessible by the first memory paths and second portions that are accessible by the second memory paths.

8. The apparatus of claim 7, wherein the first portions and the second portions are disjoint.

9. The apparatus of claim 7, wherein the first portions and the second portions are overlapping.

10. A method comprising:
    receiving a memory access request at a first processor core that is one of a plurality of processor cores formed in a first layer of an integrated circuit device, wherein:
       the memory access request indicates a location in a plurality of vertical memory columns formed above the first layer, and
       wherein each of the plurality of vertical memory columns has a footprint that overlaps with a footprint of one of a plurality of subsets of the plurality of processor cores; and
    selectively accessing the location using first memory paths in the plurality of vertical memory columns, the first memory paths connecting the plurality of subsets of the processor cores to corresponding ones of the plurality of vertical memory columns; or second memory paths that provide each of the plurality of processor cores with access to all the plurality of vertical memory columns, the second memory paths separate from the first memory paths.

11. The method of claim 10, wherein information associated with the first processor core is selectively stored in a first subset of the plurality of vertical memory columns, and wherein the first processor core selectively accesses the first subset using one of the first memory paths in response to the memory access request referring to information that is selectively stored in the first subset.

12. The method of claim 11, wherein the first processor core selectively accesses the first subset using one of the first memory paths in response to a location in the first subset being indicated by at least one of a physical address associated with the memory access request, an instruction that invokes the memory access request, a type of operation associated with the memory access request, and content of the accessed information.

13. The method of claim 10, further comprising:
bypassing a cache associated with the first processor core in response to selectively accessing the location in the plurality of vertical memory columns using at least one of the first memory paths or the second memory paths.

14. An apparatus comprising:
a plurality of processor cores formed in a first layer of an integrated circuit device;
a plurality of vertical memory columns formed above the first layer, wherein:
each of the plurality of vertical memory columns has a footprint that overlaps with a footprint of one of a plurality of subsets of the plurality of processor cores; and
an interconnect layer of the integrated circuit device deployed in a stacked configuration with the first layer and the plurality of vertical memory columns, the interconnect layer comprising:
first memory paths in the plurality of vertical memory columns that include the plurality of subsets of the plurality of processor cores and their corresponding subsets of partitions, and
second memory paths that provide each of the plurality of subsets of the plurality of processor cores with access to all of the plurality of vertical memory columns, wherein the second memory paths are separate from the first memory paths.

15. The apparatus of claim 14, wherein the plurality of subsets of the plurality of processor cores associated with the plurality of vertical memory columns comprises at least one processor core that neighbors a processor core that has an overlapping footprint with the plurality of vertical memory columns.

16. The apparatus of claim 14, wherein the plurality of processor cores can selectively access their corresponding vertical memory column via the interconnect layer using the first memory paths or any of the plurality of vertical memory columns using the second memory paths.

17. The apparatus of claim 14, further comprising:
caches associated with the plurality of processor cores, wherein at least one of the first memory paths or the second memory paths bypasses the caches.

18. The apparatus of claim 14, wherein the plurality of vertical memory columns is subdivided into first portions that are accessible by the first memory paths and second portions that are accessible by the second memory paths.

19. The apparatus of claim 18, wherein the first portions and the second portions are disjoint.

20. The apparatus of claim 19, wherein the first portions and the second portions are overlapping.

21. The apparatus of claim 14, wherein the plurality of processor cores selectively access their corresponding subsets of the plurality of vertical memory columns using the first memory paths in response to a location in the subsets of the plurality of vertical memory columns being indicated by at least one of a physical address associated with a memory access request, an instruction that invokes the memory access request, a type of operation associated with the memory access request, and content of accessed information.

22. An apparatus, comprising:
a plurality of processor cores formed in a first layer of an integrated circuit device;
a memory partitioned into vertical memory columns above the first layer, wherein footprints of the vertical memory columns overlap with corresponding footprints of subsets of the plurality of processor cores;
first memory paths providing first subsets of the processor cores with access to only the vertical memory columns that have footprints that overlap footprints of the first subsets; and
second memory paths providing second subsets of the processor cores with access to all the vertical memory columns, the second memory paths separate from the first memory paths.

* * * * *